US007500861B2

(12) United States Patent
Harkabi et al.

(10) Patent No.: US 7,500,861 B2
(45) Date of Patent: Mar. 10, 2009

(54) ELECTRICAL CONNECTOR

(75) Inventors: Dan Harkabi, Foster City, CA (US);
Gidon Elazar, Foster City, CA (US);
Nehemiah Weingarten, Foster City, CA (US)

(73) Assignee: SanDisk Secure Content Solutions, Inc, Sunnyvale, CA (US)

( * ) Notice: Subject to any disclaimer, the term of this patent is extended or adjusted under 35 U.S.C. 154(b) by 0 days.

(21) Appl. No.: 12/041,185

(22) Filed: Mar. 3, 2008

(65) Prior Publication Data
US 2008/0153352 A1 Jun. 26, 2008

Related U.S. Application Data

(62) Division of application No. 10/898,859, filed on Jul. 26, 2004, now Pat. No. 7,361,059.

(60) Provisional application No. 60/490,413, filed on Jul. 28, 2003.

(51) Int. Cl.
H01R 27/00 (2006.01)
(52) U.S. Cl. ...................... 439/218; 439/660
(58) Field of Classification Search .......... 439/660, 439/217, 218, 626, 676, 954, 494, 495, 67, 439/101, 108
See application file for complete search history.

(56) References Cited

U.S. PATENT DOCUMENTS

| 3,760,335 | A | | 9/1973 | Roberts |
| 5,270,964 | A | | 12/1993 | Bechtholsheim et al. |
| 5,295,843 | A | | 3/1994 | Davis et al. |
| 5,442,243 | A | | 8/1995 | Bailey |
| 5,540,601 | A | | 7/1996 | Botchek |
| 6,155,868 | A | * | 12/2000 | Wu et al. ............ 439/495 |
| 6,325,650 | B1 | | 12/2001 | Wilson et al. |
| 6,630,747 | B1 | | 10/2003 | Kamada et al. |
| 6,744,634 | B2 | | 6/2004 | Yen |
| 6,796,803 | B2 | | 9/2004 | Abe |
| 7,068,517 | B2 | * | 6/2006 | Yen ............ 439/374 |
| 2002/0048974 | A1 | * | 4/2002 | Michel et al. ........ 439/67 |
| 2002/0132506 | A1 | | 9/2002 | Wilson et al. |
| 2003/0171035 | A1 | | 9/2003 | Yoo |

(Continued)

FOREIGN PATENT DOCUMENTS

DE 1855448 U 7/1962

(Continued)

OTHER PUBLICATIONS

EPO/ISA, "Notification of Transmittal of the International Search Report and the Written Opinion of the International Searching Authority, or the Declaration", mailed in corresponding PCT/US2004/024167 on Dec. 12, 2004, 13 pages.

(Continued)

Primary Examiner—Felix O Figueroa
(74) Attorney, Agent, or Firm—Davis Wright Tremaine LLP

(57) ABSTRACT

An electrical connector, for example a connector that will operate with the Universal Serial Bus, is disclosed. In some embodiments, the connector includes none, one, or several tongue board, tongue tip, electrical contact, housing shell, insulating strip on the inner lining of housing shell, protective edge. A connector integral to a printed circuit board is also disclosed. Other embodiments are disclosed.

6 Claims, 13 Drawing Sheets

U.S. PATENT DOCUMENTS

| | | | |
|---|---|---|---|
| 2005/0042930 | A1 | 2/2005 | Harkabi et al. |
| 2005/0079738 | A1 | 4/2005 | Ahn |

FOREIGN PATENT DOCUMENTS

| | | |
|---|---|---|
| EP | 0571092 A2 | 11/1993 |
| EP | 1 670 101 A1 | 6/2006 |
| FR | 2583929 | 12/1986 |
| JP | 2003217728 A | 7/2003 |
| KR | 100424781 B | 3/2004 |
| WO | WO 2005/013436 A | 2/2005 |

OTHER PUBLICATIONS

Compaq et al. "Universal Serial Bus Specification," Rev. 2.0, Apr. 27, 2000, "Table of Contents" and "Chapter 6 Mechanical," pp. 85-118.

Examiner's Report for European Patent Application No. 04 779 295.7 dated Feb. 14, 2007, 4 pages.

Office Action for Chinese Patent Application No. 200480021538.5 for SanDisk Corporation, dated Aug. 10, 2007, 7 pages.

USPTO, "Office Action," mailed in related U.S. Appl. No. 10/898,859 on Nov. 30, 2005, 6 pages.

USPTO, "Office Action," mailed in related U.S. Appl. No. 10/898,859 on May 8, 2006, 5 pages.

USPTO, "Office Action," mailed in related U.S. Appl. No. 10/898,859 on Oct. 11, 2006, 11 pages.

USPTO, "Notice of Allowance and Fee(s) Due," mailed in related U.S. Appl. No. 10/898,859 on Dec. 26, 2007, 5 pages.

China State Intellectual Property Office, "Second Office Action," corresponding Chinese Patent Applicaton No. 200480021538.5, mailed on Mar. 21, 2008, 11 pages (including translation.).

* cited by examiner

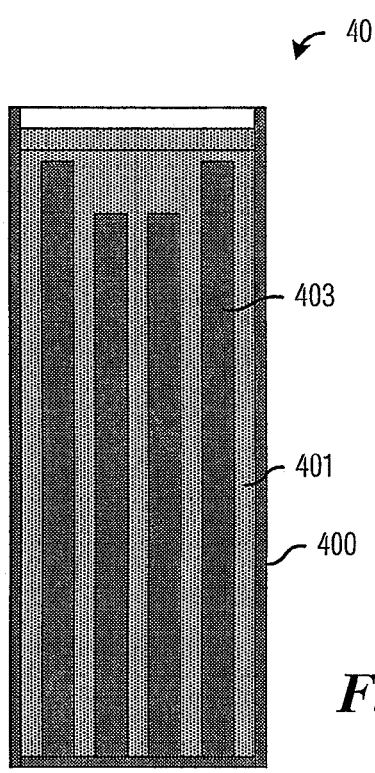
Fig. 10a
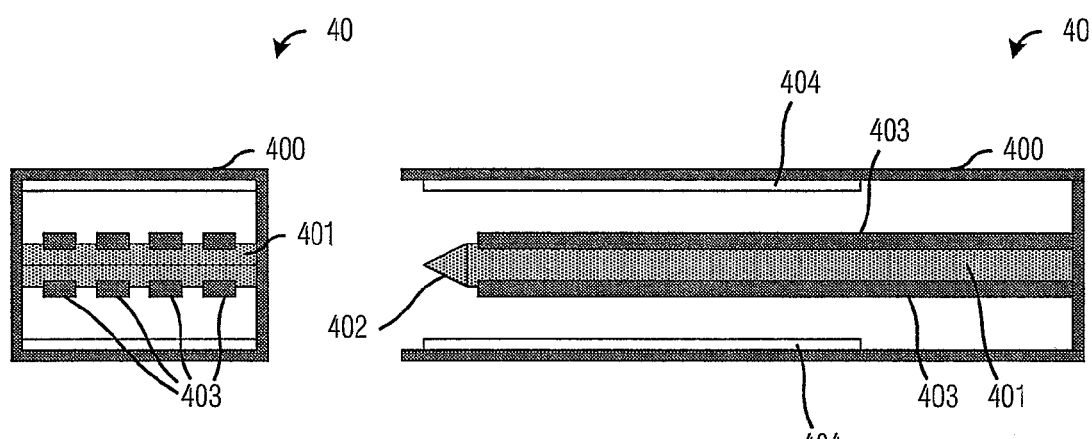
Fig. 10b     Fig. 10c

ELECTRICAL CONNECTOR

This application claims the benefit of U.S. Provisional Application No. 60/490,413, filed on Jul. 28, 2003, entitled Electrical Connector, which application is hereby incorporated herein by reference.

TECHNICAL FIELD

The present invention relates to an electrical connector, and more particularly to a Universal Serial Bus (USB) connector.

BACKGROUND

In many situations, computers are connected to peripherals or electronic appliances using wire connections. One type of wire connection is the Universal Serial Bus (hereafter USB) cable. A USB cable may be used to electrically connect a computer with peripherals and other electronic appliances. Examples of computer peripherals are input devices such as a mouse and a keyboard, output devices such as printers, and input/output devices such as external hard drives and flash memory drives. Examples of electronic appliances are digital cameras, PDAs, and MP3 players.

In the late 1990's the USB standard became the preferred connection interface in the computer industry and has become ubiquitous in almost all computers manufactured today. Laptop computers, desktop computers, and other computing machines are manufactured with USB ports in order to take advantage of the variety of peripheral devices and electronic appliances that are built around USB architecture. (See www.USB.org)

The Universal Serial Bus and USB connectors are well known in the art. The pervasiveness of the USB standard and USB connectors has increased utility to consumers, substantially increased data transfer rates over other interface methods and reduced costs for manufacturers of peripheral devices due to standardization. Computer vendors typically incorporate one or more USB ports into their suite of Input Output ports.

A USB cable used to connect peripherals or electronic appliances to a computer is comprised of 2 endpoints known as connectors or plugs. One connector, known as Series "A" plug, is attached to the host computer and the other, known as Series "B" plug, is attached to the connecting appliance. Series "A" and Series "B" plugs are of different shape and size so as not to confuse between them. The interface connection on the host computer is called USB mount port (hereafter USB port). The USB port is comprised of a Series "A" receptacle that mates with a Series "A" plug. Electrically, Series "A" receptacles function as outputs from host systems. FIG. 1 shows a prior art Series "A" plug 10, which mates with a Series "A" receptacle 12. The Series "A" plug always is oriented towards the host system. Photographs of the plug and connector are shown in the provisional application Ser. No. 60/490,413, filed Jul. 28, 2003, entitled "Electrical Connector" (hereinafter "the provisional application") which is incorporated herein by reference.

The computer host USB port is an open receptacle with a flat, internal rectangular card bearing electrical contact points. The cable series "A" plug connecting to the host receptacle terminates in a rectangular sleeve that is inserted into the host receptacle. The sleeve contains a tongue board bearing matching electrical contact points to those of the host receptacle. The insertion of sleeve to the receptacle affixes the card and tongue thus creating a mated electrical connection.

Some peripheral devices do not employ a USB cable to connect to a computer but rather utilize a USB connector as part of their assembly. Examples are keychain storage devices (see www.diskonkey.com, www.thumbdrive.com) or security keys (see www.ealaddin.com). The provisional application shows an example of a USB drive plugged into a host PC USB port. Keychain storage devices, due to their small dimensions, serve as portable storage media, and as such are often used with several computers. Therefore, these devices are plugged in and out of host computers many times.

There is unfortunately a shortcoming in the physical design of the USB connector, which manifests itself when a attempting to insert a USB connector into a USB port. Referring again to FIG. 1, it can be seen that while seeming symmetric to touch and sight externally, both the receptacle 12 and the plug 10 are asymmetric internally. In the host receptacle, this is due to the positioning of the rectangular card 101 and electrical connectors 102 inside the receptacle. FIGS. 2a-2c show an example of a USB host receptacle 100. FIG. 2 depicts three views of a USB receptacle of the prior art. In particular, FIG. 2a shows a front section, FIG. 2b shows a side view section, and FIG. 2c shows a bottom side view section. Referring to these figures, a rectangular card 101 is located within the receptacle 100. Electric contact points 102 are formed on the card 101.

FIGS. 3a-3c depict an example of a Series "A" USB plug of the prior art. In particular, FIG. 3a depicts a top view section, FIG. 3b depicts a front view section, and FIG. 3c depicts a side view section. The prior art plug connector includes a shell 200. A tongue board 201 is located within the shell and electric contact points 202 are formed on the tongue board. Similarly, inside the USB connector shell 200, the tongue 201 and electrical contacts 202 are positioned in a non-symmetric manner.

In many cases, the host USB port is located at an angle in which users can't comfortably see the inside of the receptacle, and it is unclear to the user how to align the plug for proper insertion and electrical mating. FIGS. 4 and 5 depict mating a USB plug and a USB receptacle of the prior art. The rectangular sleeve of a USB plug fits correctly into the rectangular receptacle 100 of the USB port only when the internal rectangular card 101 of the receptacle and the internal tongue board 201 of the USB plug are correctly facing each other as shown in FIG. 4. FIG. 5 illustrates the case when the plug is correctly inserted into the receptacle. When this is not the case, an electric mating is not possible as the internal rectangular card 101 of the receptacle and the internal tongue board 201 of the USB connector collide as shown in FIGS. 6a and 6b, also prior art. FIG. 6a shows a view similar to that of FIG. 5 except that the receptacle 100 and shell 200 are not properly aligned. FIG. 6b shows the collision 205 that results from this misalignment.

In some cases, users may not see the internal alignment in the host USB receptacle because it is positioned in the back or on the side of the computer. Statistically, since there are seemingly two alignment possibilities when connecting the rectangular plug to the rectangular receptacle, but only one correct alignment, there is a 50% chance of failed insertion attempts. The result is a degradation of the user experience in working with USB devices. As more devices connect to computers using USB connectors, this problem intensifies. For keychain storage devices that are plugged many times in and out of many computers, this inconvenience intensifies.

There is clearly an unmet need for a plug mechanism that is operable with the USB that allows correct insertion of the plug into a USB port without necessitating user consideration of plug alignment.

SUMMARY OF THE INVENTION

In one aspect, the present invention provides a solution to the problem stated above and describes improvements of the USB plug. In one exemplary embodiment (hereafter SLIM embodiment), the connector tongue board is not housed in a shell. The tongue board, which has two sets of contact points, one on each side of the tongue board, may be correctly inserted into host receptacle in two alignments. Since the contact points are present on both sides of the tongue board, any alignment will provide proper electrical mating.

In another exemplary embodiment of the invention (hereafter FLEX embodiment), the solution is achieved by using a flexible tongue board that can position itself according to the computer receptacle's rectangular card position, thus achieving electrical mating in every insertion. Here too, exist two sets of contact points, one on each side of the flexible tongue board.

In order to reduce manufacturing and assembly costs, yet another exemplary embodiment is presented in which the novel connector which is operable with the USB receptacle is part of the Printed Circuit Board (PCB) of the peripheral device.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims and that such equivalent constructions fall within the scope of the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 10 is a schematic diagram of an exemplary FLEX embodiment of the present invention, in 3 views 10a-10c;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description of exemplary embodiments of the invention, reference is made to the drawings that illustrate specific exemplary embodiments in which the invention may be practiced. Those skilled in the art will appreciate that other embodiments may be utilized without departing from the spirit of the present invention; therefore the following detailed description of the invention should not be taken in a limiting sense.

The preferred embodiment of the present invention is an improvement of existing USB series "A" plugs. This improvement is achieved by providing electrical contact points on both sides of connector tongue board, thus facilitating the insertion of the improved plug connector for devices operable with the USB into USB host computers.

Figure 1:
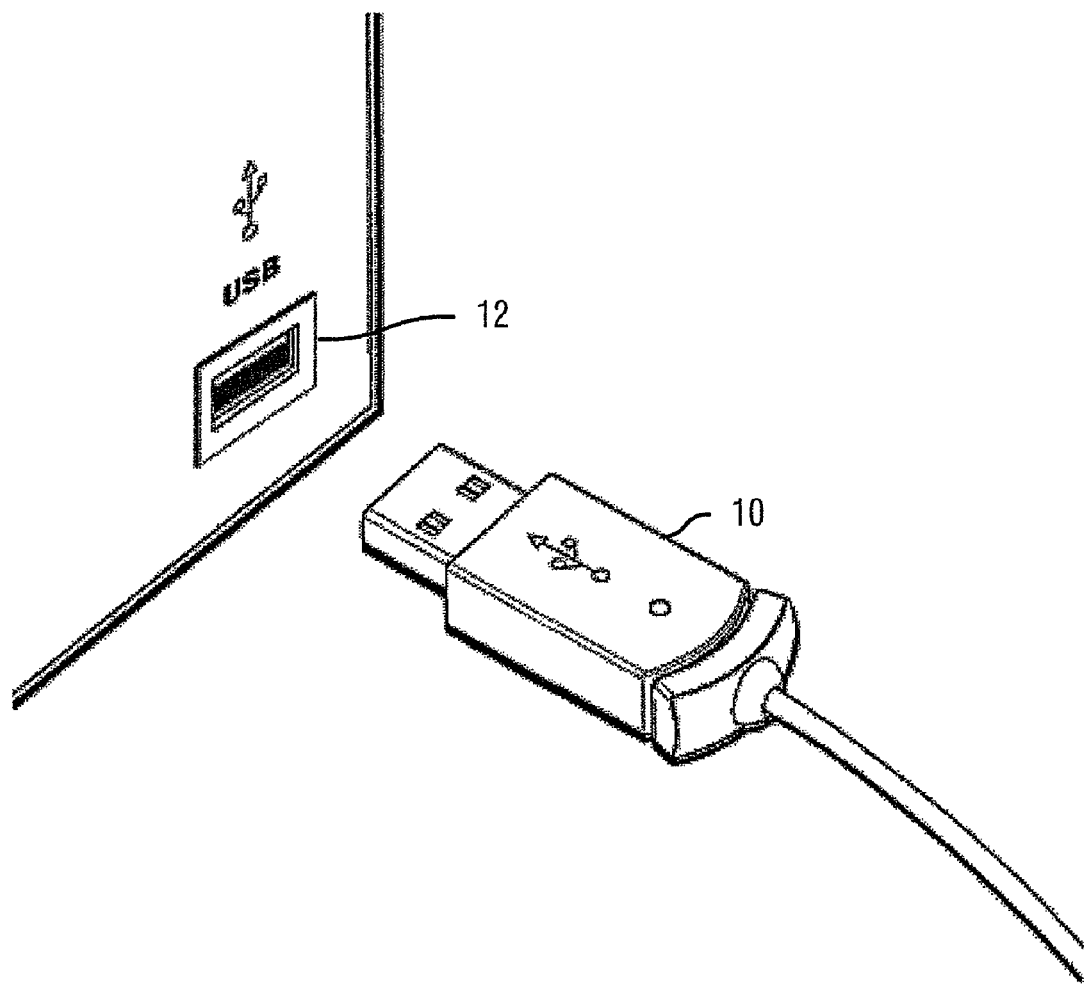
FIG. 1 depicts a series "A" USB plug on a USB cable and a series "A" USB receptacle of the prior art.
Figure 2A:
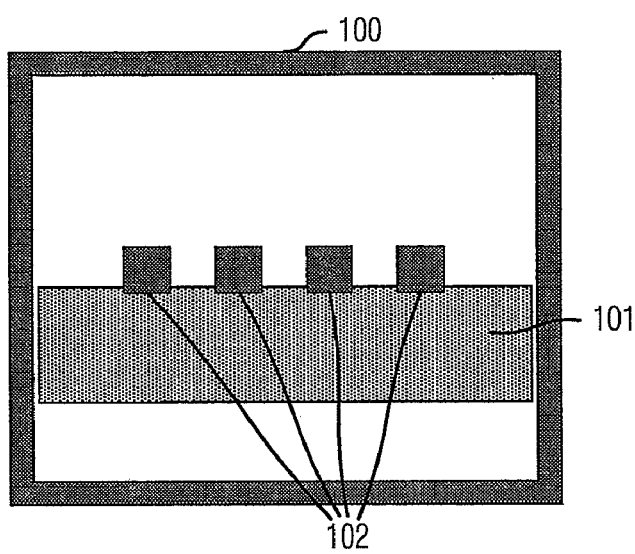
FIGS. 2a-2c depict various views of a prior art USB receptacle.
Figure 2B:
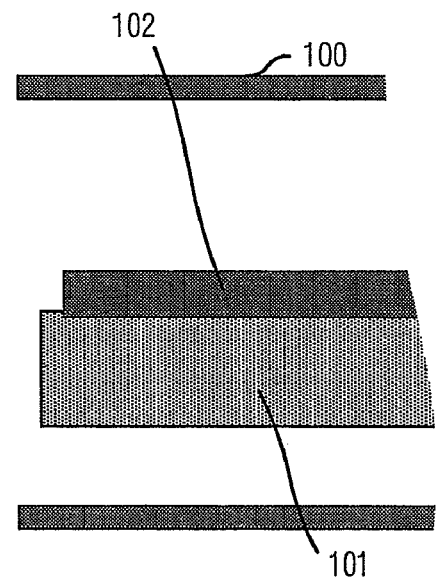
Figure 2C:
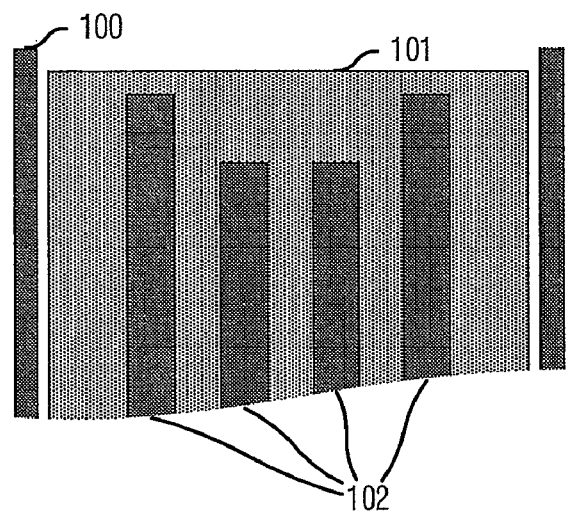
Figure 3A:
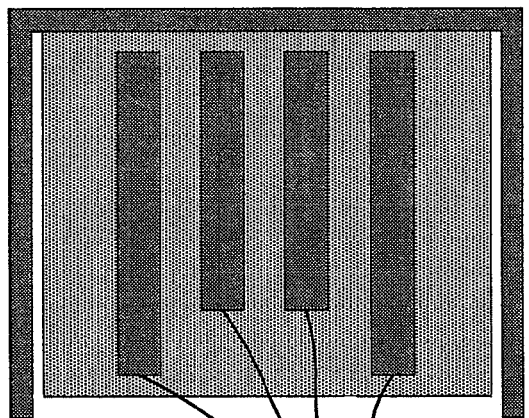
FIGS. 3a-3c depict various views of a prior art USB plug.
Figure 3B:
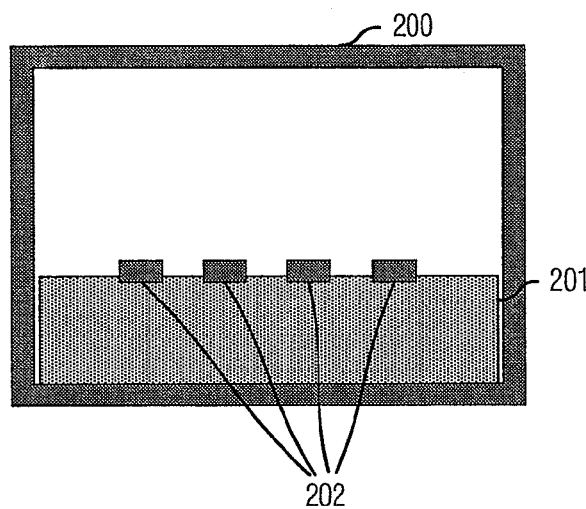
Figure 3C:
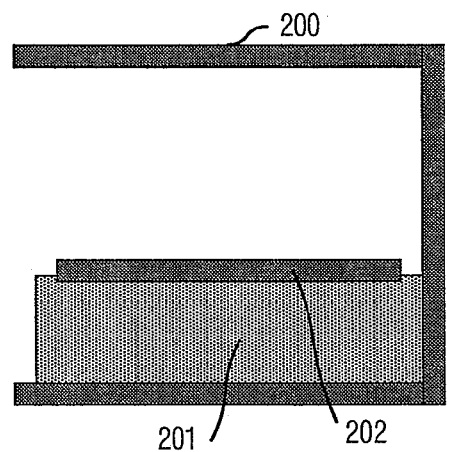
Figure 4:
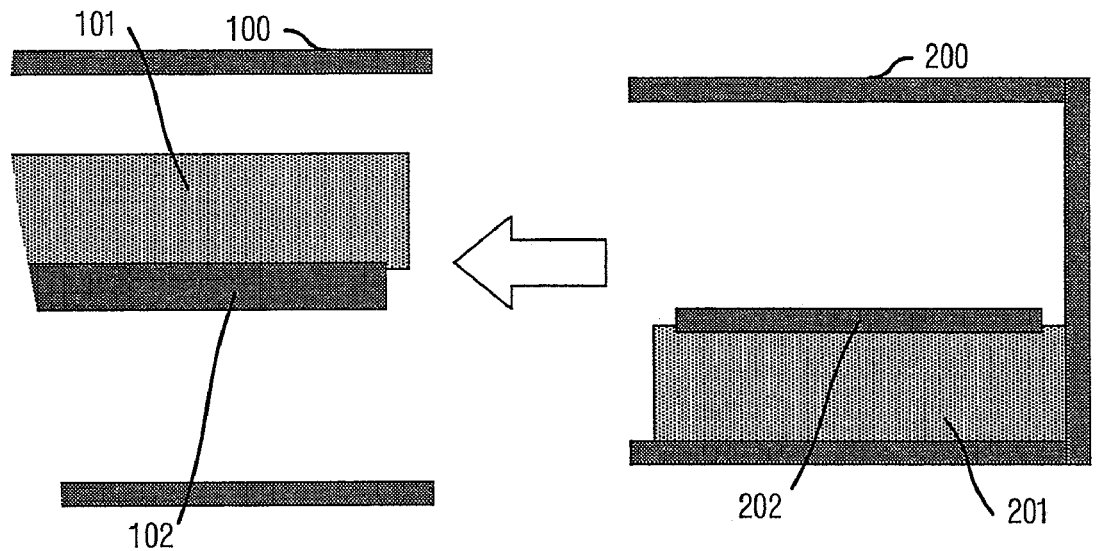
FIG. 4 depicts the proper alignment of a prior art USB plug inserted into a host USB receptacle.
Figure 5:
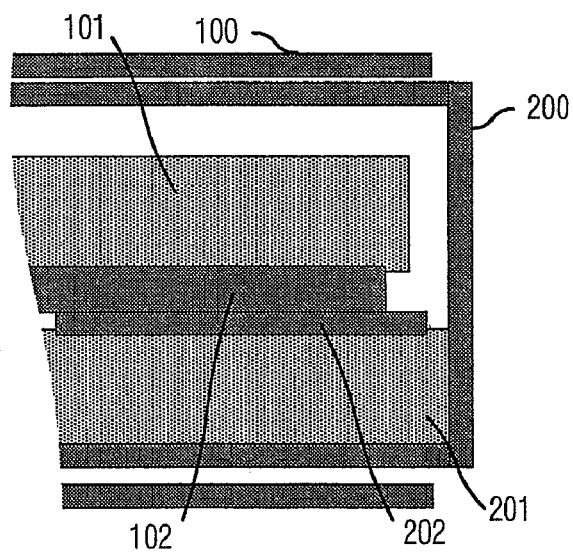
FIG. 5 depicts the combination of a properly inserted USB plug and a USB receptacle of the prior art mated in correct alignment.
Figure 6A:
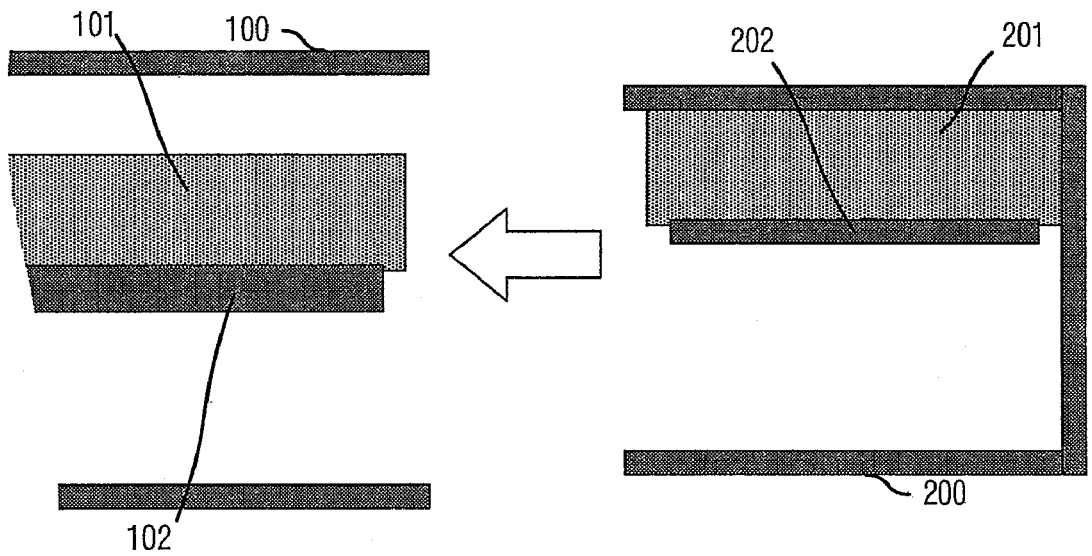
FIGS. 6a-6b illustrate an improper attempt to insert a USB plug of the prior art into a host USB receptacle.
Figure 6B:
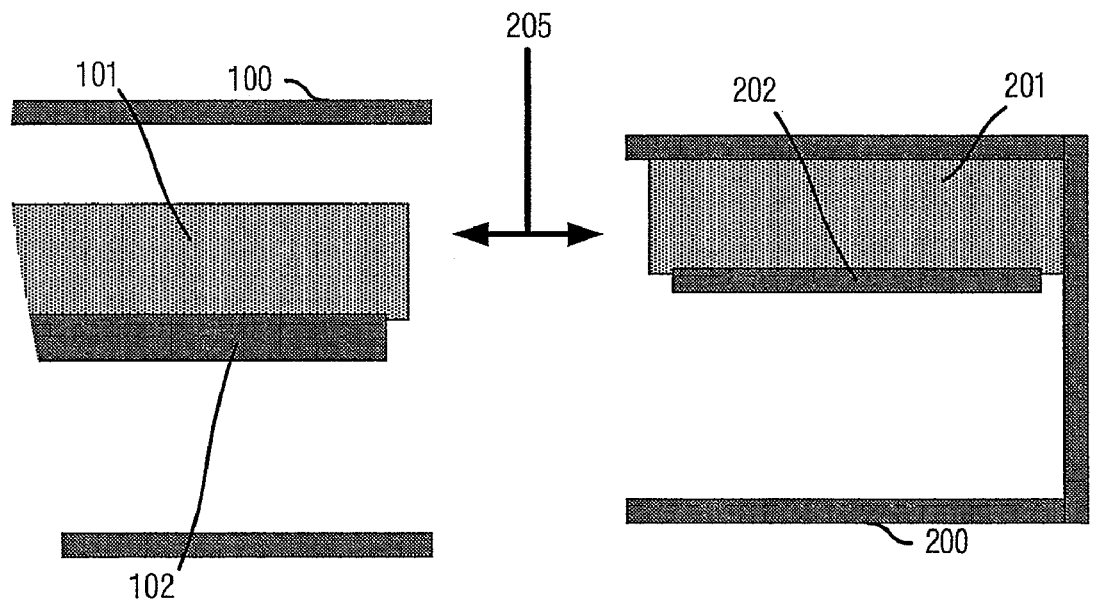
Figure 7A:
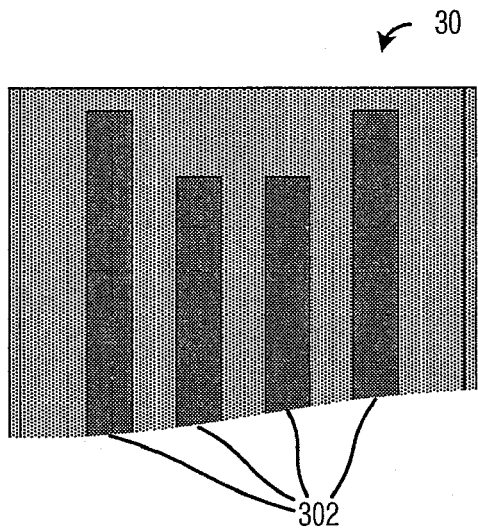
FIG. 7 is a schematic diagram of an exemplary SLIM embodiment of the present invention, in 4 views 7a-7d.
Figure 7B:
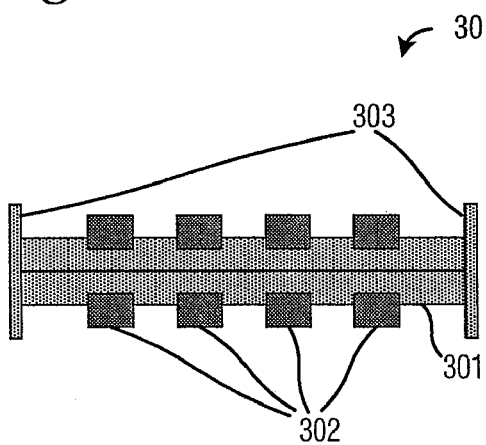
Figure 7D:
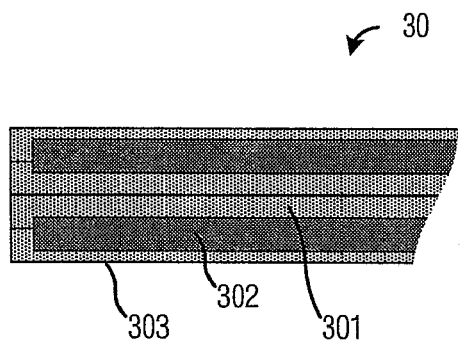
Figure 7C:
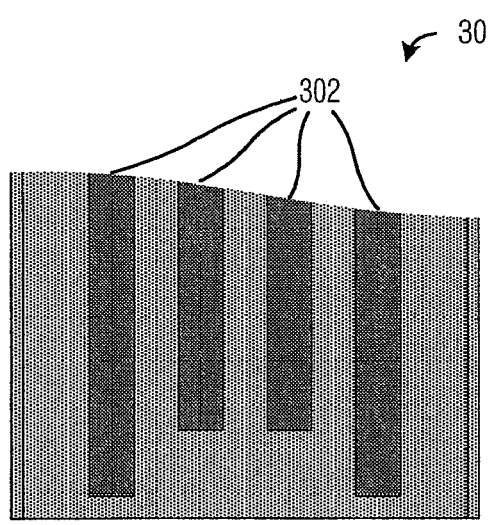

FIG. 7, which includes the top view of FIG. 7a, the front view of FIG. 7b, the bottom view of FIG. 7c, and the top side view of FIG. 7d, depicts electrical plug 30 in accordance with one embodiment of the present invention (SLIM embodiment). The plug 30 includes a tongue 301, a plurality of contacts 302 on both sides of tongue 301, and protective edges 303. The tongue 301 may be the endpoint of a USB cable, or an integral part of a peripheral device, such as a keychain storage device.

Figure 9A:
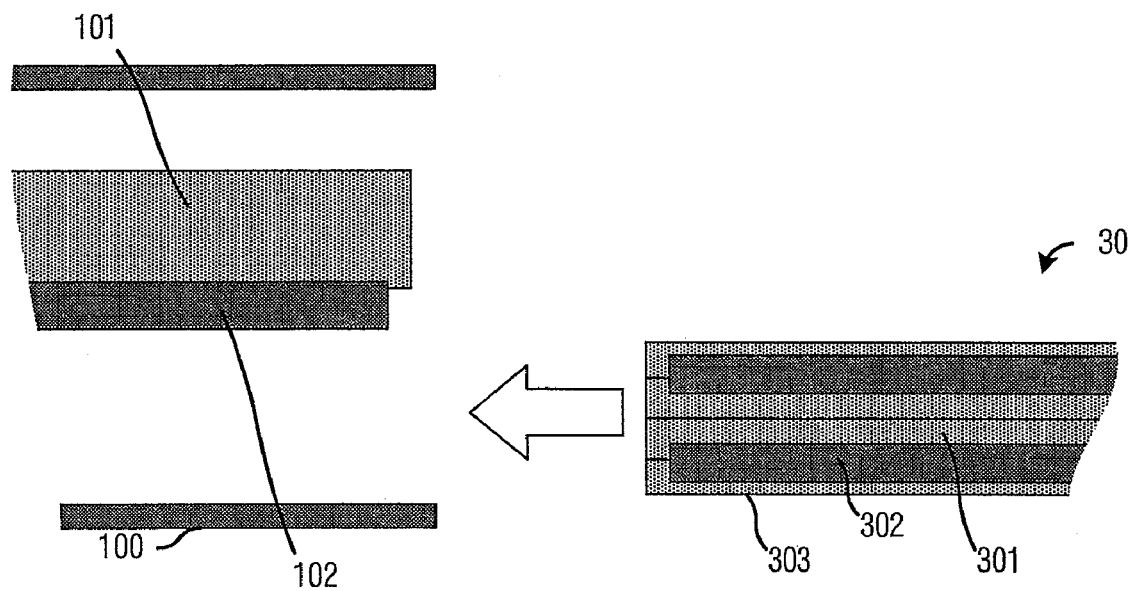
FIGS. 9a-b illustrate the insertion of an exemplary SLIM embodiment of the present invention into a host USB port.
Figure 9B:
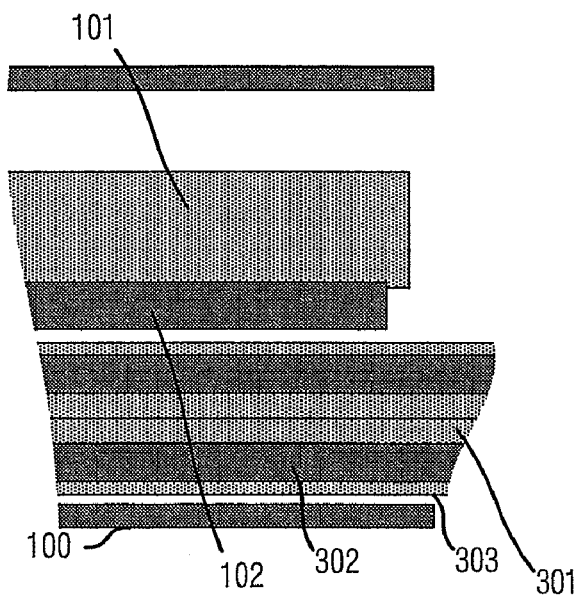

FIGS. 9a and 9b depict an attempt to connect plug 30 to a USB receptacle 100. The physical structure of plug 30 is symmetric on the lateral axis. When the tongue 301 encounters USB receptacle 100, tongue 301 takes up the free space available in receptacle 100, and creates an electric connection.

Electrical contacts 302 are present on both sides of tongue 301. This ensures that insertion of tongue 301 into receptacle 100 in either of two possible alignments will produce proper electrical mating. In order to assure that each of electrical contact points 302 are mated with the correct electrical contact points 102 in USB port 1, regardless of original alignment of tongue 301, the electrical contact points on each side of tongue 301 are oppositely aligned, as shown in FIG. 8.

Figure 8:
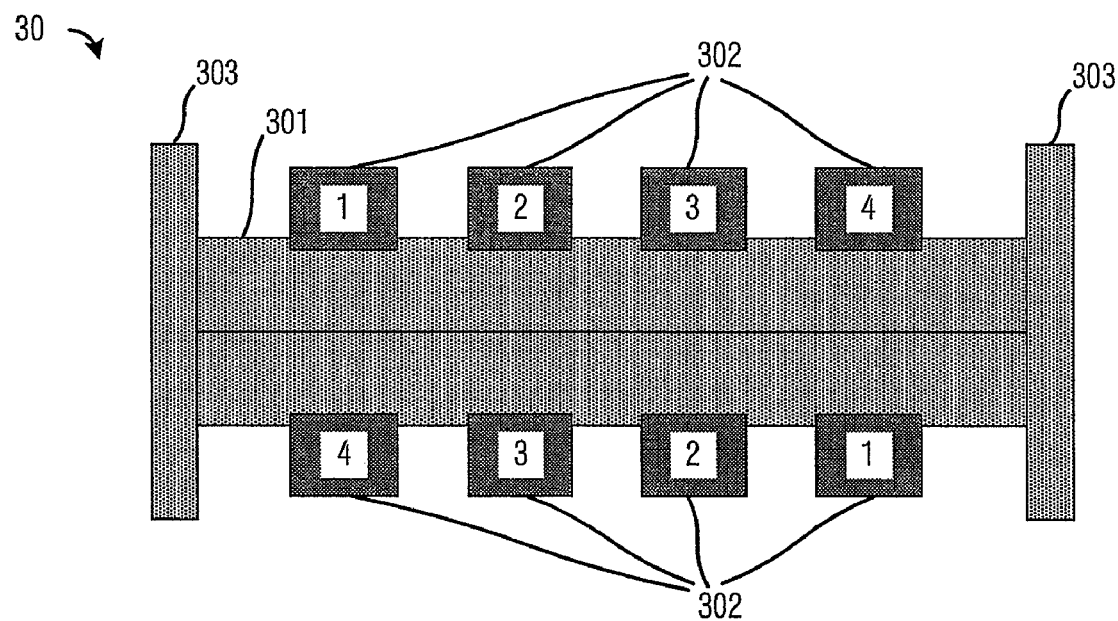
FIG. 8 is a schematic diagram of an exemplary SLIM embodiment of the present invention in a side view, including the layout of the electrical contact points of present embodiment of the invention.

In FIG. 8, the electric contact points 302 are each labeled with a number 1, 2, 3, or 4. In the preferred embodiment, the contact points carry electrical signals as defined by Table 1.

TABLE 1

| Contact Point | Signal Line |
|---|---|
| 1 | GND |
| 2 | Signal A |
| 3 | Signal B |
| 4 | VCC |

In some instances, USB receptacle 100 may serve as common electrical ground. In order to avoid short-circuiting the electrical contact points 302 on the opposite side of tongue 301 that are not participating in the electrical mating, protective edges 303 are used. The protective edges 303 protrude from tongue 301 a little more than the electrical contacts 302 do, and thus prevent physical connection to housing 100 that might otherwise cause a short circuit.

FIGS. 10a (top view), 10b (front view), and 10c (side view) show an electrical plug 40 in accordance with another embodiment of the present invention (FLEX embodiment). The plug 40 includes a shell 400, a flexible tongue 401, a tongue tip 402, a plurality of contacts 403 on both sides of flexible tongue 401, and insulating strips 404. The flexible tongue 401 is positioned inside shell 400, in the center of the lateral axis of shell 400.

Figure 12A:
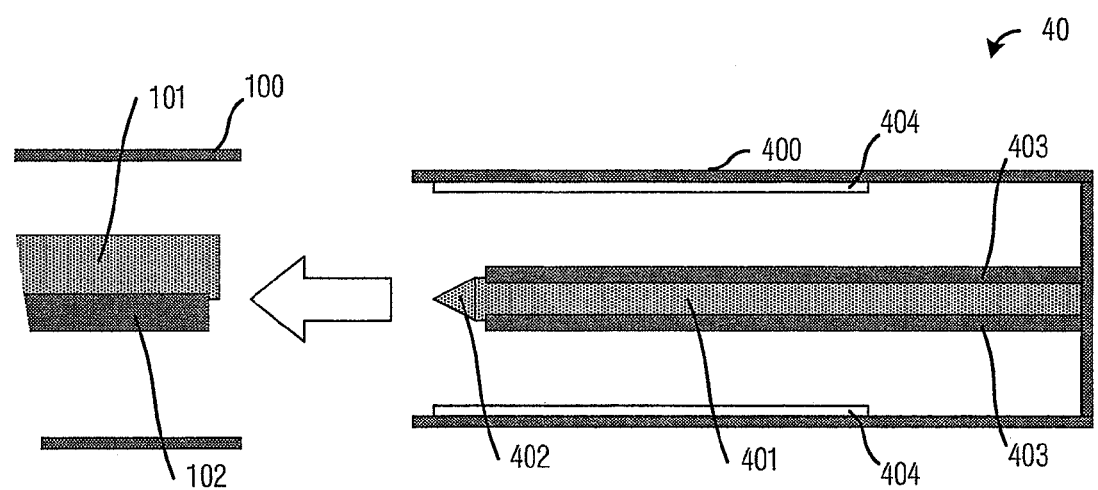
FIGS. 12a-c illustrate the insertion of an exemplary FLEX embodiment of the present invention into a host USB port.
Figure 12B:
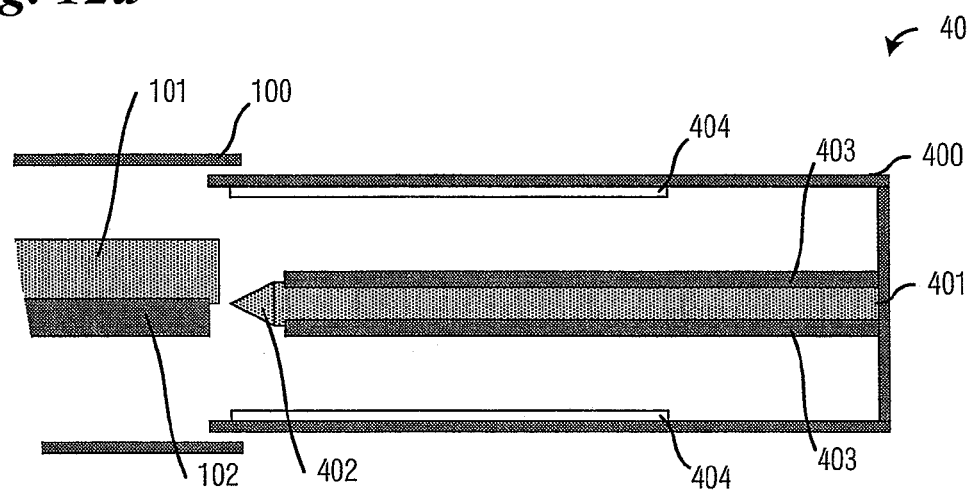
Figure 12C:
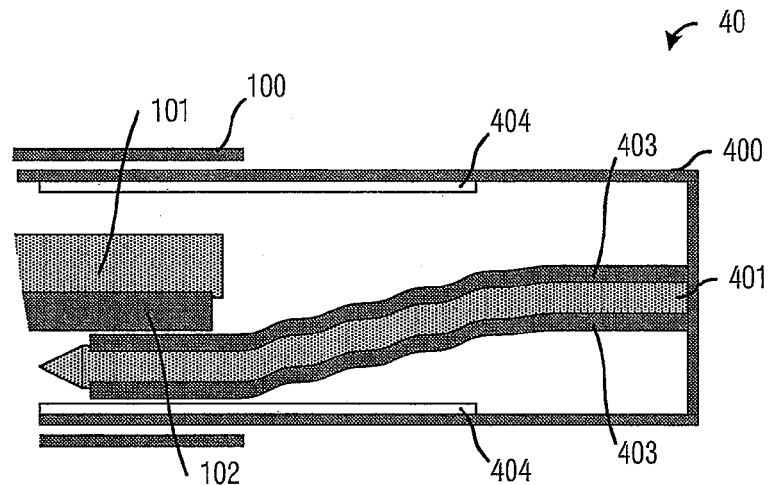
Figure 13A:
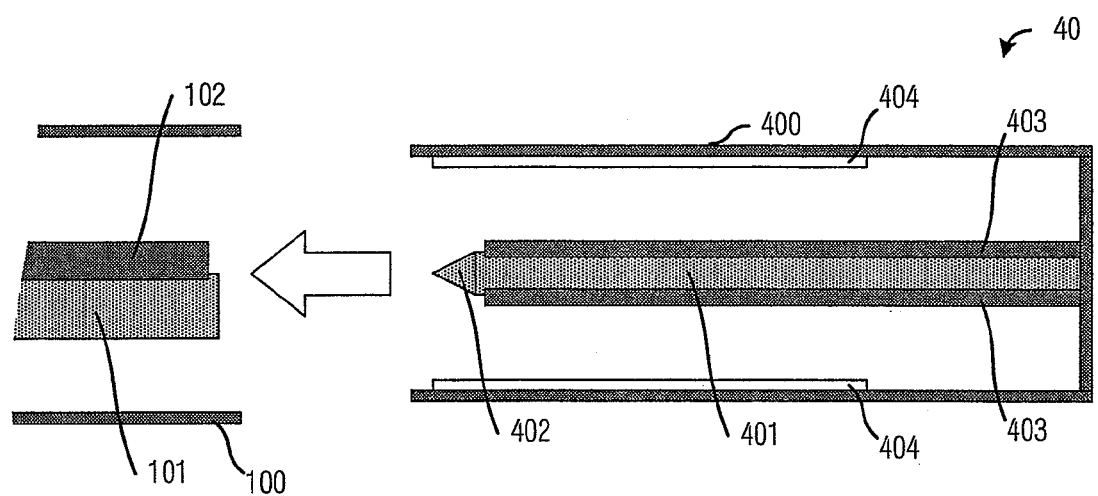
FIGS. 13a-c are another illustration of the insertion of a FLEX embodiment of the present invention into a host USB port.
Figure 13B:
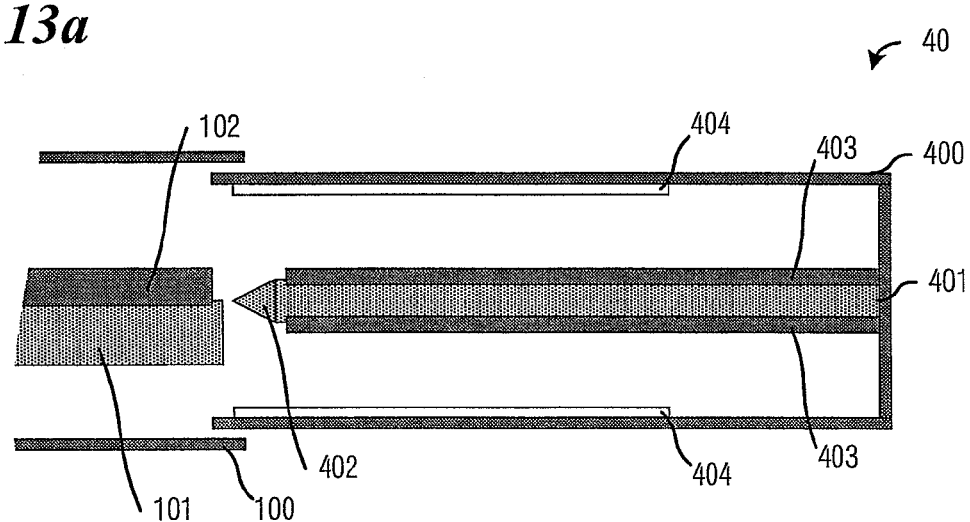
Figure 13C:
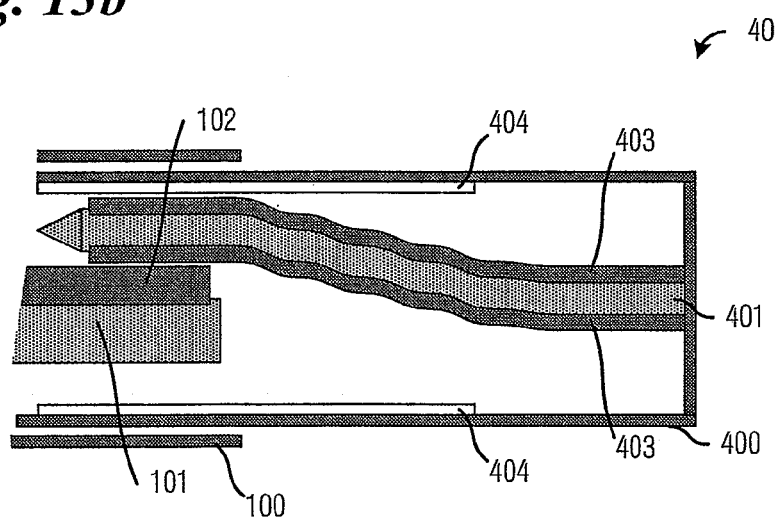

FIGS. 12a-12c depict an attempt to connect plug 40 to a USB receptacle 100. FIG. 12a shows the plug 40 before mating. FIG. 12b shows alignment of the flexible tongue 401 upon encountering the rectangular card 101. FIG. 12c shows the plug after it has been mated. FIGS. 13a-13c are similar views illustrating the same operation, except that the tongue 401 flexes in the opposite direction. The structure of plug 40 is symmetric on the lateral axis, as the tongue board is located in the middle of the shell 400. When the shell 400 encounters receptacle 100, tongue tip 402 faces rectangular card 101 and helps to divert flexible tongue 401 and avoid a collision of rectangular card 101 and flexible tongue 401. As insertion of shell 400 into receptacle 100 continues, flexible tongue 401 takes up the free space available in receptacle 100, and creates an electric connection.

Electrical contacts 403 are present on both sides of flexible tongue 301 in order to assure not only insertion of plug 40 into USB receptacle 100 but proper electrical mating whether flexible tongue has to move down as shown in FIG. 12 or up as shown in FIG. 13.

In some USB connectors, shell 400 may serve as common electrical ground. In order to avoid short-circuiting the electrical contact points 403 not participating in the electrical mating, insulation strips 404 are lined inside shell 400.

Figure 11:
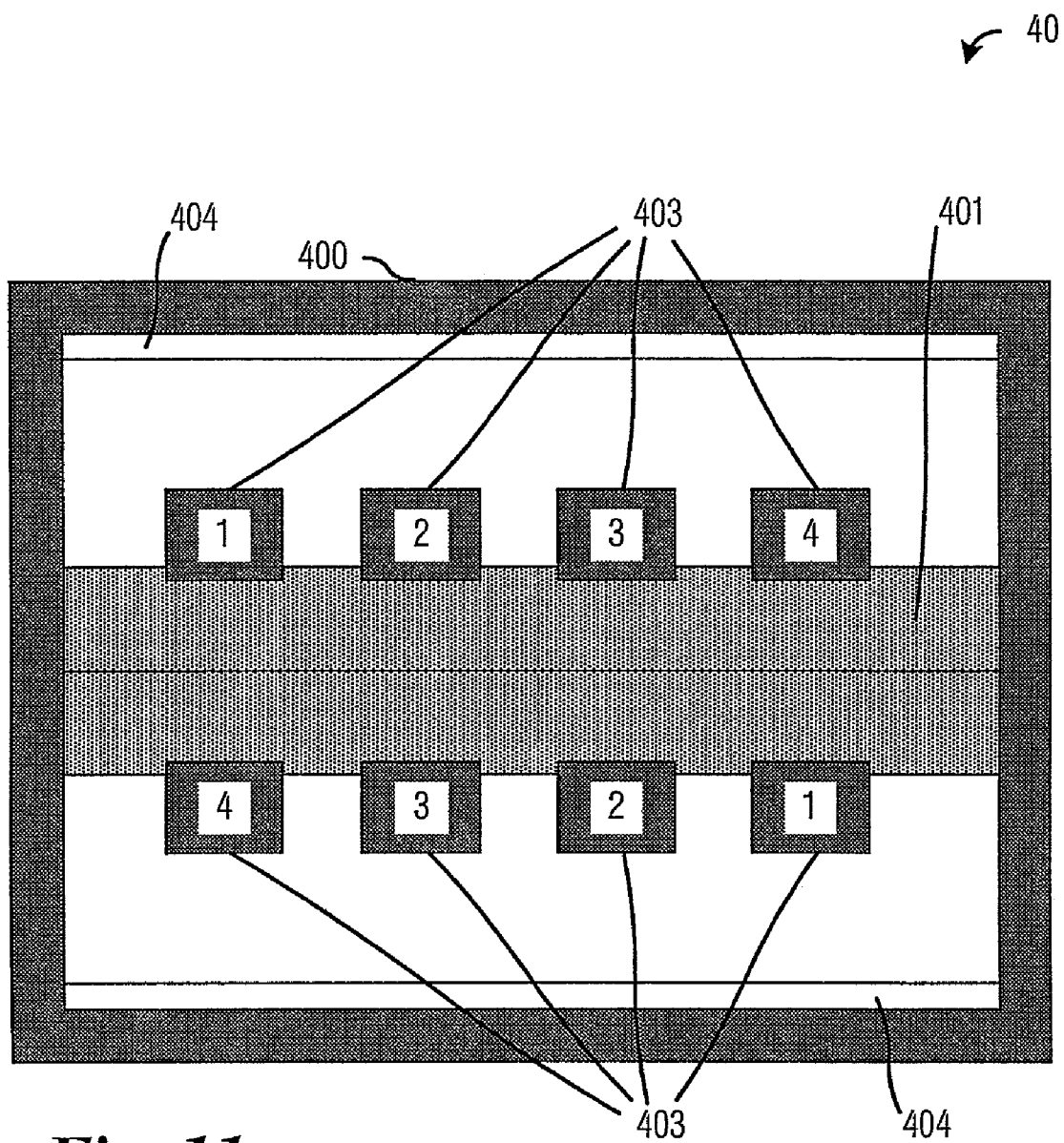
FIG. 11 is a schematic diagram of an exemplary FLEX embodiment of the present invention in a side view, including layout of the electrical contact points of the present embodiment of the invention.

In order to ensure that each electrical contact point 402 is mated with the correct electrical contact point 102 in USB port 1, regardless of original alignment of flexible tongue 401, the electrical contact points on each side of flexible tongue 301 are oppositely aligned, as shown in FIG. 11. The signals/supply voltages corresponding to the contact points are shown in Table 1.

Figure 14A:
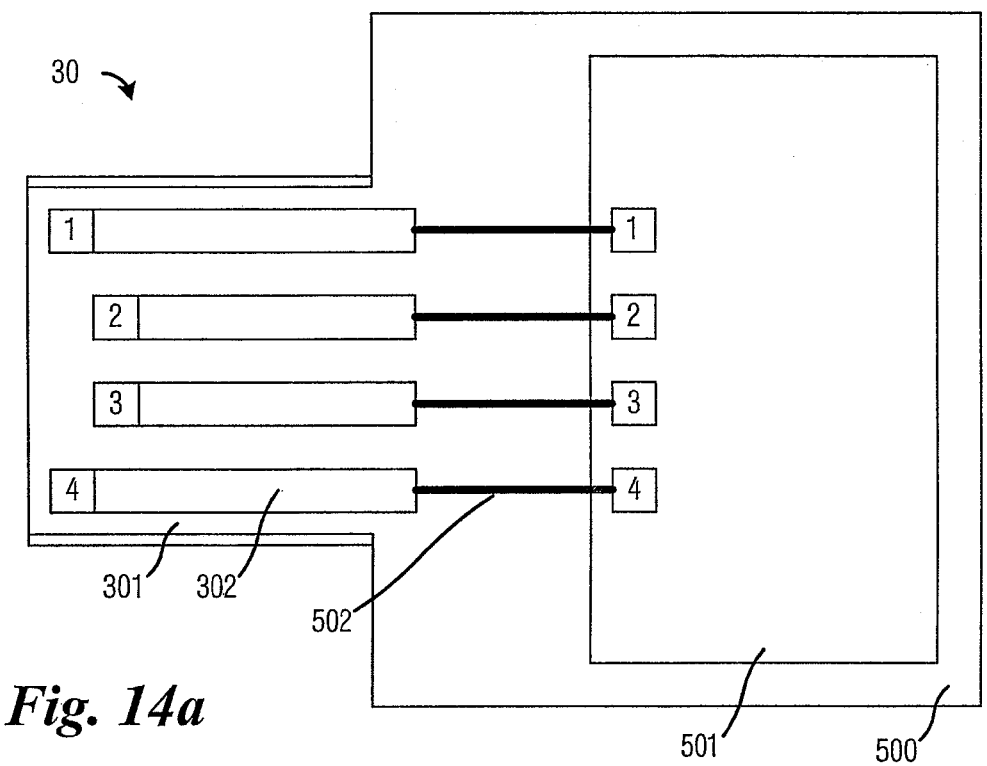
FIGS. 14a-b are schematic diagrams of another embodiment of the present invention, in which the USB connector of the invention is an integral part of the peripheral device PCB.
Figure 14B:
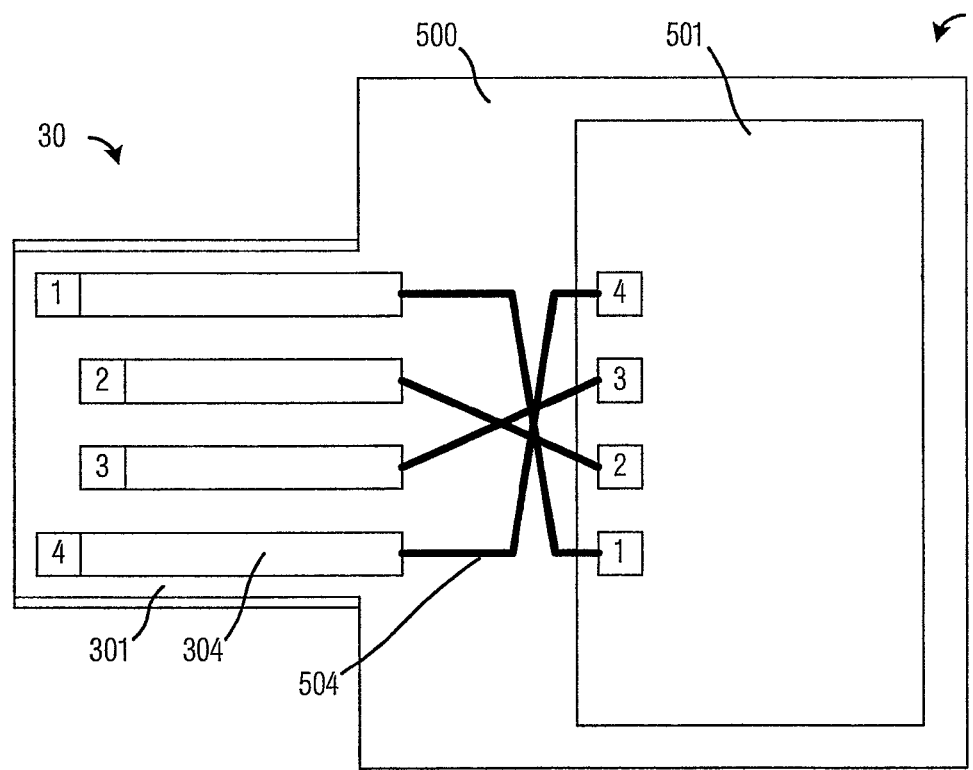

FIGS. 14a and 14b show an example of a SLIM embodiment in which the present invention is used to connect a peripheral device 50 to a USB host computer (not shown) without the use of a cable. The electrical plug 30 is an integral part of the printed circuit board (PCB) 500. Internal electronics 501 are connected to top electric contact points 302 by using internal electronic contacts 502. In the top view of FIG. 14a, top internal electric contacts 502 are directly connected to top electric contact points 302. In the bottom view of FIG. 14b, electrical plug 30 must maintain same order and positioning of bottom electric contact points 304 relative to top electric contact points 302. Internal electronics 501, however, are the same chip (e.g., piece of silicon) both top and bottom. Therefore, bottom internal electric contacts 504 must be crossed to match bottom electric contact points 304. By reducing the number of parts needed to assemble peripheral device 50, lower manufacturing costs are achieved.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A dual-sided electrical connector for coupling to a USB compliant receptacle, comprising:

support means for supporting electrical contacts for carrying signals;

first contact means for carrying a first set of signals disposed on one side of the support means conducting the data signals and voltages required to interface with a USB standard compliant receptacle;

second contact means disposed on an opposite side of said support means and being associated with said first contact means, said second contact means being positioned in reverse symmetry from said first contact means;

whereby the electrical connector will electrically mate to a USB standard compliant receptacle irrespective of whether the electrical connector is initially oriented in a first possible alignment or a second possible alignment with respect to the USB receptacle; and housing means surrounding and spaced apart from said support means;

whereby said support means is flexible and at least part of which is displaceable towards either side of said housing means when the connector is inserted into a receptacle.

2. An electrical connector, comprising:

a tongue flexible along its length;

first set of one or more electrical contacts located on a first side of the tongue and extending along its length; and a second set of one or more electrical contacts located on a second side of the tongue and extending along its length, each of said second set of electrical contacts associated with a respective one of the first set of electrical contacts and being positioned in reverse symmetry with the first set of contacts;

whereby the electrical connector will electrically and physically mate to a corresponding receptacle when inserted into the receptacle, irrespective of whether the electrical connector is initially oriented in a first possible alignment or a second possible alignment with respect to the receptacle; and a housing located around said tongue and being spaced apart from said tongue to allow at least part of said flexible tongue to be displaced toward one side or the other of the housing.

3. The electrical connector of claim 2 and further comprising a tongue tip at the end of said tongue which is narrow at the end and wider adjacent said tongue such that said tongue tip will displace at least part of said flexible tongue to one side of the housing when the connector is inserted into a receptacle, the electrical contacts on said tongue thereby electrically and physically mating to the electrical contacts within the receptacle.

4. The electrical connector of claim 3 wherein the first and second set of electrical contacts are configured for conducting the data signals and ground and supply voltages which comply with the universal serial bus (USB) standard.

5. The electrical connector of claim 4 wherein the connector mates with a receptacle that is a USB standard "A type" compliant receptacle.

6. The electrical connector of claim 3, wherein:

the first set of electrical contacts is placed in an order starting from one side of the connector of a ground voltage, a first signal A, a second signal B, and a positive supply voltage; and the second set of electrical contacts is placed in a reverse order starting from the same side of the connector of the positive supply voltage, the second signal B, the first signal A, and the ground voltage;

whereby the signals on the top surface of the connector are always in the same order regardless of which side of the electrical connector is oriented upwards.

* * * * *